US012787198B1

(12) United States Patent
Tan et al.

(10) Patent No.: US 12,787,198 B1
(45) Date of Patent: Nov. 3, 2026

(54) SELF-FETCHING FASTENER FOR PORTABLE COMMUNICATION DEVICE

(71) Applicant: MOTOROLA SOLUTIONS, INC., Chicago, IL (US)

(72) Inventors: Beng Kwang Tan, Bayan Lepas (MY); Selva Kumar AL Kannan, Kulim (MY); Chun Wen Ooi, Georgetown (MY); Wooi Ping Teoh, Tanjung Tokong (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 98 days.

(21) Appl. No.: 18/903,738

(22) Filed: Oct. 1, 2024

(51) Int. Cl.
*H05K 7/14* (2006.01)

(52) U.S. Cl.
CPC ......... *H05K 7/1407* (2013.01); *H05K 7/1427* (2013.01)

(58) Field of Classification Search
CPC ....... H05K 7/1407; H05K 7/1427; H05K 5/02
See application file for complete search history.

(56) References Cited

U.S. PATENT DOCUMENTS 8,277,158 B2 10/2012 Csik et al.
9,520,658 B1* 12/2016 Schmit .................. H01R 4/302
2004/0198079 A1* 10/2004 Aronson .............. G02B 6/4256 439/76.1
2004/0212973 A1* 10/2004 Ice ...................... H05K 7/1404 361/796
2005/0042057 A1 2/2005 Konig et al.
2006/0192730 A1* 8/2006 Kim ......................... H05K 5/02 345/60
2010/0124034 A1* 5/2010 Shouyama ........... H05K 7/1418 361/756
2011/0031985 A1* 2/2011 Johnson ............... H05K 1/0275 324/681
2011/0157849 A1* 6/2011 Liu ........................ H05K 7/142 361/752
2016/0295710 A1* 10/2016 Ueyama ............... H05K 7/1417
2016/0313773 A1* 10/2016 Kim ........................ G06F 1/189
2018/0084680 A1* 3/2018 Jarvis .................... G06F 1/1637
2019/0170179 A1 6/2019 Hara et al.
2020/0383226 A1* 12/2020 Tagawa .................... H01R 4/30
2021/0091452 A1 3/2021 Sando et al.
(Continued)

FOREIGN PATENT DOCUMENTS

EP 4178030 A1 5/2023

OTHER PUBLICATIONS

International Search Report and Written Opinion for Application No. PCT/US2025/045883 dated Jan. 8, 2026 (16 pages).

*Primary Examiner* — Sagar Shrestha
(74) *Attorney, Agent, or Firm* — Michael Best & Friedrich LLP

(57) ABSTRACT

A fastening assembly for coupling a printed circuit board (PCB) to a housing of a portable communication device including a pocket defining a slide axis, an inner surface, and a top surface that is spaced away from the PCB. The fastening assembly further includes a nut disposed within the pocket and interfaced with the inner surface to inhibit rotation of the nut about the slide axis. The fastening assembly further includes a fastener extending through the PCB to threadably engage the nut when rotated relative to the nut. The nut translates along the slide axis when the fastener is rotated until the nut abuts the PCB.

20 Claims, 6 Drawing Sheets

(56) References Cited

U.S. PATENT DOCUMENTS

| | | | | |
|---|---|---|---|---|
| 2021/0185838 | A1 | 6/2021 | Yang | |
| 2022/0384953 | A1 | 12/2022 | Shin et al. | |
| 2024/0276666 | A1 * | 8/2024 | Lee | H05K 7/142 |

* cited by examiner

SELF-FETCHING FASTENER FOR PORTABLE COMMUNICATION DEVICE

BACKGROUND

Portable communication devices, such as two-way radios, cellular phones, satellite phones, and the like, are often designed to withstand damage that may be caused by, for example, dropping the device. These devices often include an outer housing, a chassis, subframes, and other internal components that need to be properly coupled together to form an operational portable device.

SUMMARY

One example provides, a fastening assembly for coupling a printed circuit board (PCB) to a housing of a portable communication device, the fastening assembling including a pocket defining a slide axis, an inner surface, and a top surface that is spaced away from the PCB. A nut is disposed within the pocket and interfaced with the inner surface to inhibit rotation of the nut about the slide axis. A fastener extends through the PCB to threadably engage the nut when rotated relative to the nut. The nut translates along the slide axis when the fastener is rotated until the nut abuts the PCB.

Another example provides, a method of assembling a portable communication device. The method includes inserting a nut within a pocket; and inserting a printed circuit board (PCB) into a housing along a direction generally parallel to longitudinal axis of the housing. The PCB is spaced away from the pocket The method also includes aligning an aperture of the PCB with the pocket; and inserting a fastener through the aperture to engage a nut within the pocket and rotating the fastener to threadably engage the nut, causing the nut to slide within the pocket along a slide axis until the nut abuts the PCB. The slide axis is perpendicular to the longitudinal axis.

Another example provides, a portable communication device that includes a housing having a first end, a second end, and a longitudinal axis extending between the first end and the second end. The communication device also includes a printed circuit board (PCB) disposed within the housing and including an aperture through which a fastener extends to couple the PCB relative to the housing. A pocket defines a slide axis that extends along a direction perpendicular to the longitudinal axis. A top surface is spaced away from the PCB. An inner surface supports a nut and inhibits the nut from rotating about the slide axis The nut translates along the slide axis when the fastener is rotated until the nut abuts the PCB.

Other examples, embodiments, features, and aspects will become apparent by consideration of the following detailed description and accompanying drawings.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments, examples, aspects, and features that include the claimed subject matter, and explain various principles and advantages.

Figure 1:
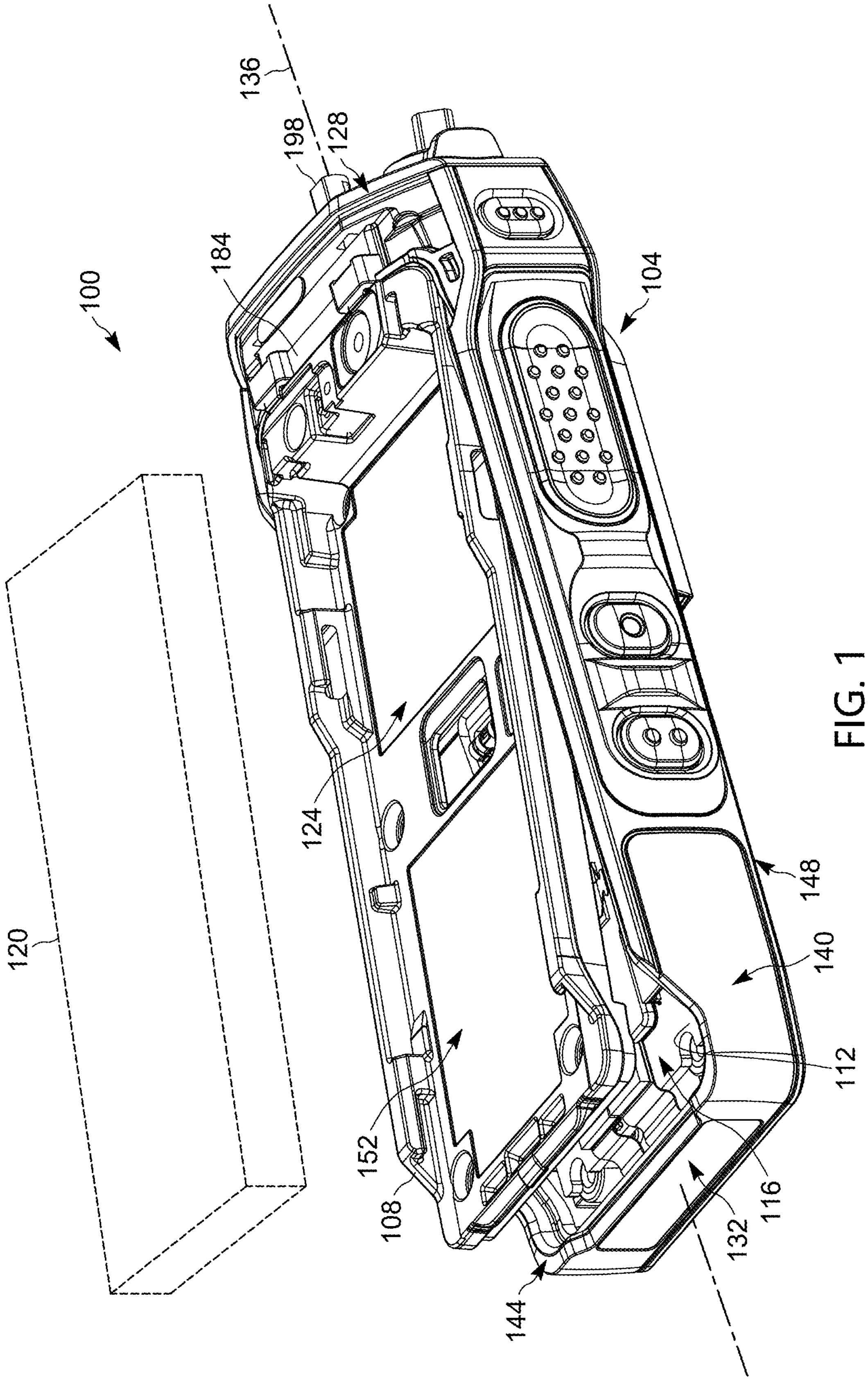
FIG. 1 is a perspective view of a portable communication device in accordance with one example, illustrating a housing, a printed circuit board (PCB), and a chassis.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments, examples, aspects, and features.

The apparatus and method components have been represented where appropriate by conventional symbols in the drawings, showing only those specific details that are pertinent to understanding the embodiments, examples, aspects, and features described and illustrated so as not to obscure the disclosure with details that will be readily apparent to those of ordinary skill in the art having the benefit of the description herein.

DETAILED DESCRIPTION

FIG. 1 illustrates an example of a portable communication device 100. In the example shown, the portable communication device 100 includes a housing 104, a chassis 108, and a printed circuit board (PCB) 112. The chassis 108 couples to the housing 104 to form an internal chamber 116, in which the PCB 112 is disposed. The internal chamber 116 is formed between the housing 104 and the chassis 108. A battery 120 is configured to supply power to the portable communication device 100 and is installed within a battery receptacle 124. The battery receptacle 124 is defined on the chassis 108.

In the illustrated example, the battery 120 is a rechargeable battery and may be removably coupled to the battery receptacle 124. The battery 120 is a lithium-ion battery while, in other examples, the battery 120 may alternatively include other chemistries.

With continued reference to FIG. 1, the housing 104 defines a first end 128, a second end 132, and a longitudinal axis 136 that extends between the first end 128 and the second end 132. Typically, a user holds the portable communication device 100 in an upward orientation, such that the first end 128 is above the second end 132. The housing 104 also defines opposing sides (e.g., a first side 140 and a second side 144) that extend generally parallel to the longitudinal axis 136. The opposing sides 140, 144 also extend between the first end 128 and the second end 132. The opposing sides 140, 144 may include various controls, such as a power buttons, talk button, volume buttons, or other user interface controls. In the illustrated example, the first side 140 includes the various controls while, in other examples, the various controls may alternatively be provided on other parts of the housing 104. On the inner periphery of the housing 104, the opposing sides 140, 144 act as rails to limit movement of the PCB 112 within the housing 104. In the example shown, the opposing sides 140, 144 inhibit movement of the PCB 112 relative to the housing 104 in a direction perpendicular to the longitudinal axis 136. In one example, the housing 104 is composed of a polymer material, such as plastic or other suitable material.

In the example shown, the housing 104 also defines a first or front face 148, which may include a microphone, digital display, speaker, and/or other various controls. In this example, the housing 104, when coupled to the chassis 108, defines a second or rear face 152. The rear face 152 includes the battery receptacle 124 and is configured to electrically and physically interface with the battery 120.

Figure 2:
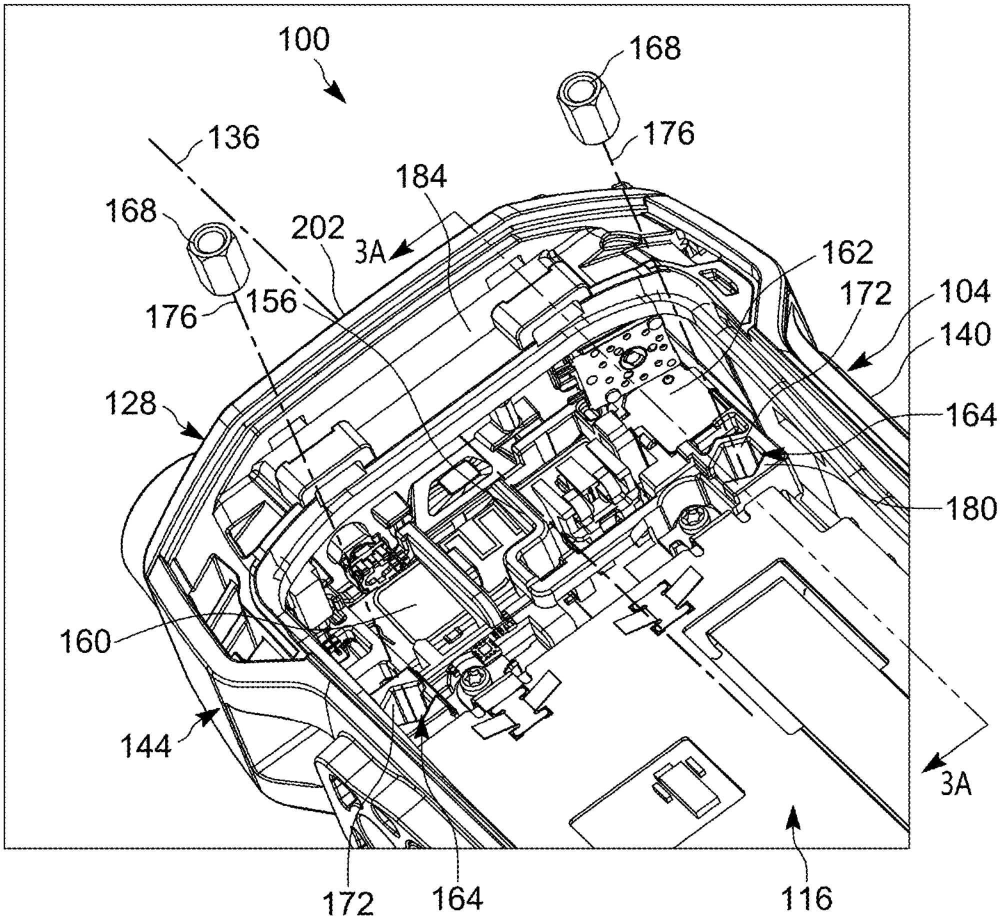
FIG. 2 is an enlarged perspective view of the portable communication device of FIG. 1, illustrating a pair of pockets in the housing each receiving a nut.

With reference to FIG. 2, the portable communication device 100 further includes an antenna subframe 156 that is coupled to the housing 104. Specifically, the antenna subframe 156 is coupled to the housing 104 adjacent the first end 128. The illustrated antenna subframe 156 is coupled to the housing 104 via suitable fasteners, but may otherwise be coupled via snap-fit, press-fit, or other similar means. In some examples, the antenna subframe 156 is integrally formed and part of the housing 104. In this example, the antenna subframe 156 receives and supports a short-range antenna 160 (e.g., a Wi-Fi antenna), which is then inserted and assembled with the internal chamber 116 of the housing 104. The antenna subframe 156 may support other electronic components, such as a microphone flex 162. In some examples, the antenna subframe 156 may support other components and may be composed of a polymer material, such as plastic or other suitable material.

The illustrated antenna subframe 156 includes a pair of pockets 164 that are each configured to receive a nut 168 (FIG. 2). The pockets 164 are cavities formed through the antenna subframe 156, such that the pockets 164 define an inner surface 172 and a slide axis 176 that is centered relative to the inner surface 172. Also, the slide axis 176 extends along a direction that is perpendicular to the longitudinal axis 136. At least one of the pockets 164 is adjacent the microphone flex 162. The pair of pockets 164 further define a top surface 180 that generally corresponds to the top surface of the antenna subframe 156. In the example shown, the pockets 164 are non-circular and receive the nut 168, which is also non-circular to inhibit the nut 168 from rotating within the pocket 164 about the slide axis 176. In one example, the inner surface 172 is hex-shaped and is configured to receive and support the nut 168, which is a hex nut. In other examples, the pockets 164 may alternatively be other geometries or shapes, such as splines, square, oval, or other similar non-circular shapes. When the nut 168 is received within the pocket 164, a top surface 182 of the nut 168 sits substantially flush with the top surface 180 of the pocket 164. As explained in further detail below, each nut 168 may slide or translate within the respective pockets 164 along the slide axis 176, such that the nuts 168 may extend beyond the top surface 180 of the pockets 164.

Figure 3A:
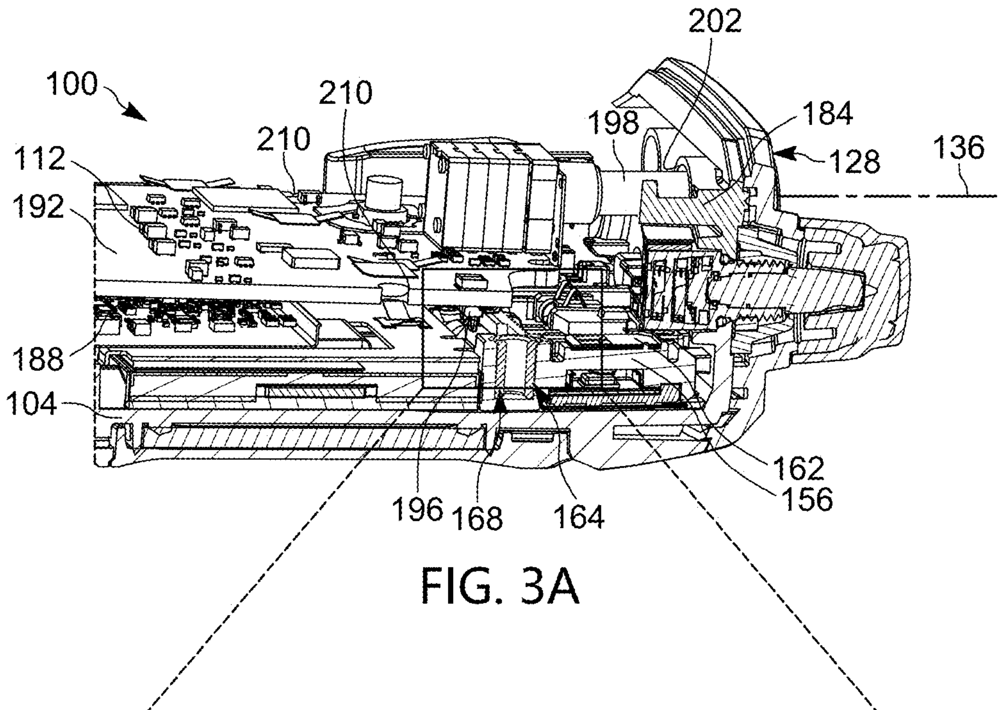
FIG. 3A is a cross-sectional view of the portable communication device along line 3A-3A of FIG. 2, illustrating one of the nuts received within one of the pockets.

As is better understood by referring to FIGS. 2 and 3A, in one example the housing 104 also includes a cantilevered overhang 184 adjacent the first end 128. The cantilevered overhang 184 extends in a direction from the first end 128 toward the second end 132 and at least partially overlaps the antenna subframe 156, and therefore, the short-range antenna 160. In the example shown, the cantilevered overhang 184—being part of the housing 104—is also composed of a polymer material. The use of a polymer or other non-conductive material decreases interference of signals produced and emitted from the short-range antenna 160 because the amount of metallic material disposed adjacent and around the short-range antenna 160 (which may cause signal interference) is reduced. In the example shown in FIGS. 1 and 2, the cantilevered overhang 184 is configured to abut and interface with a portion of the chassis 108 when the chassis 108 is coupled to the housing 104.

Figure 3B:
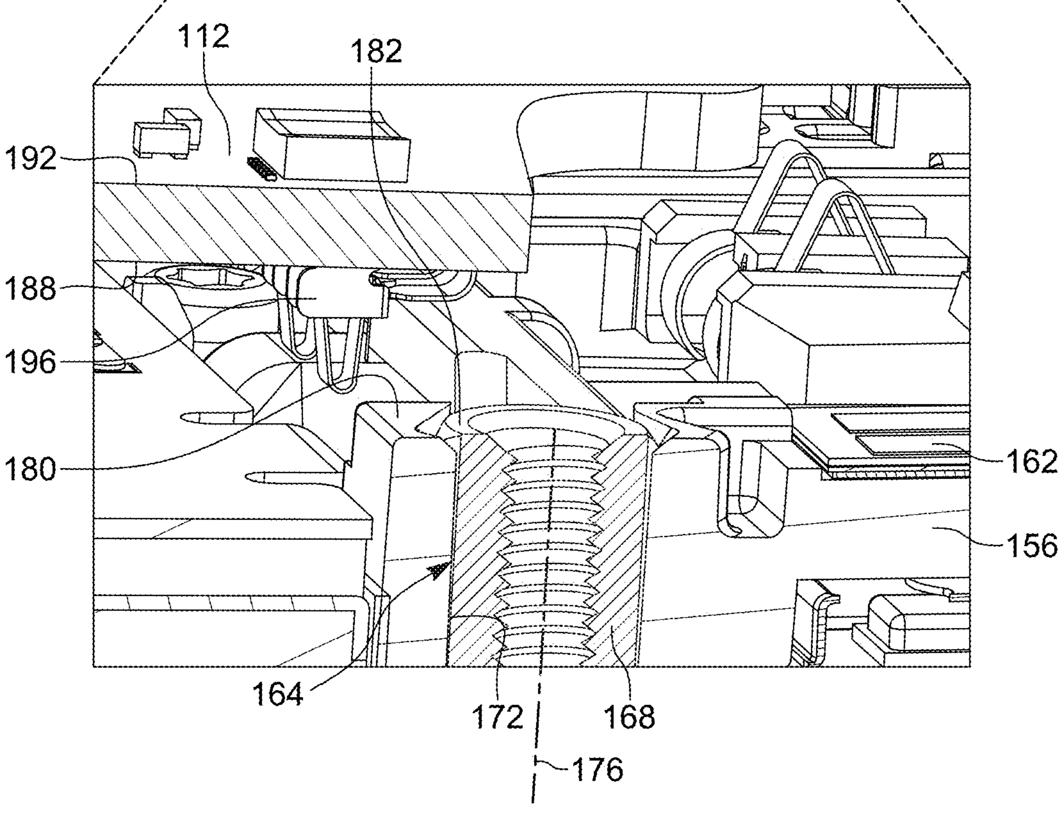
FIG. 3B is an enlarged cross-sectional view of the portable communication device of FIG. 3A, illustrating the PCB being assembled into the housing.
Figure 4A:
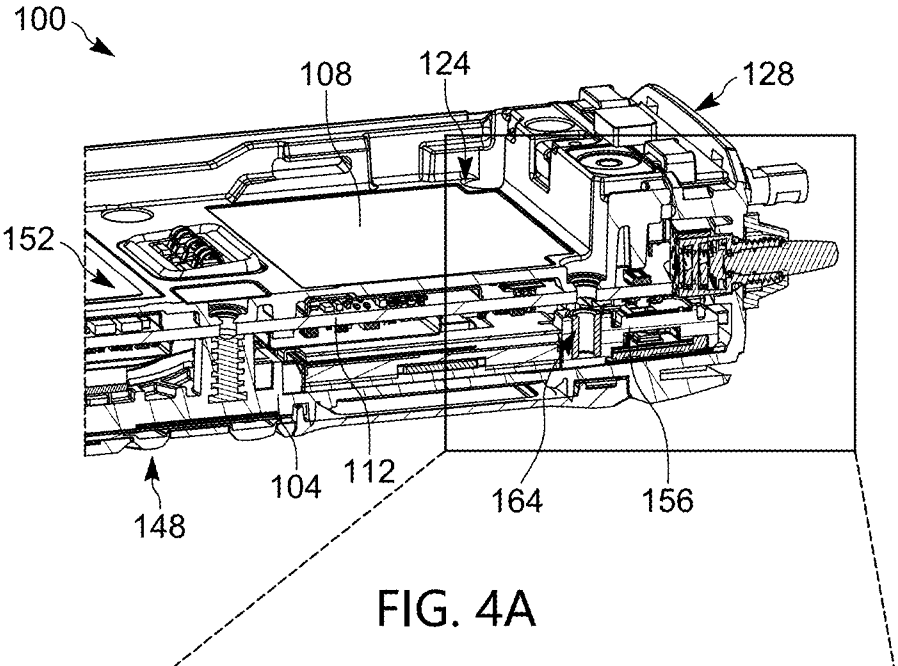
FIG. 4A is a cross-sectional view of the portable communication device along line 3A-3A of FIG. 2, illustrating the chassis being assembled onto the housing.
Figure 4B:
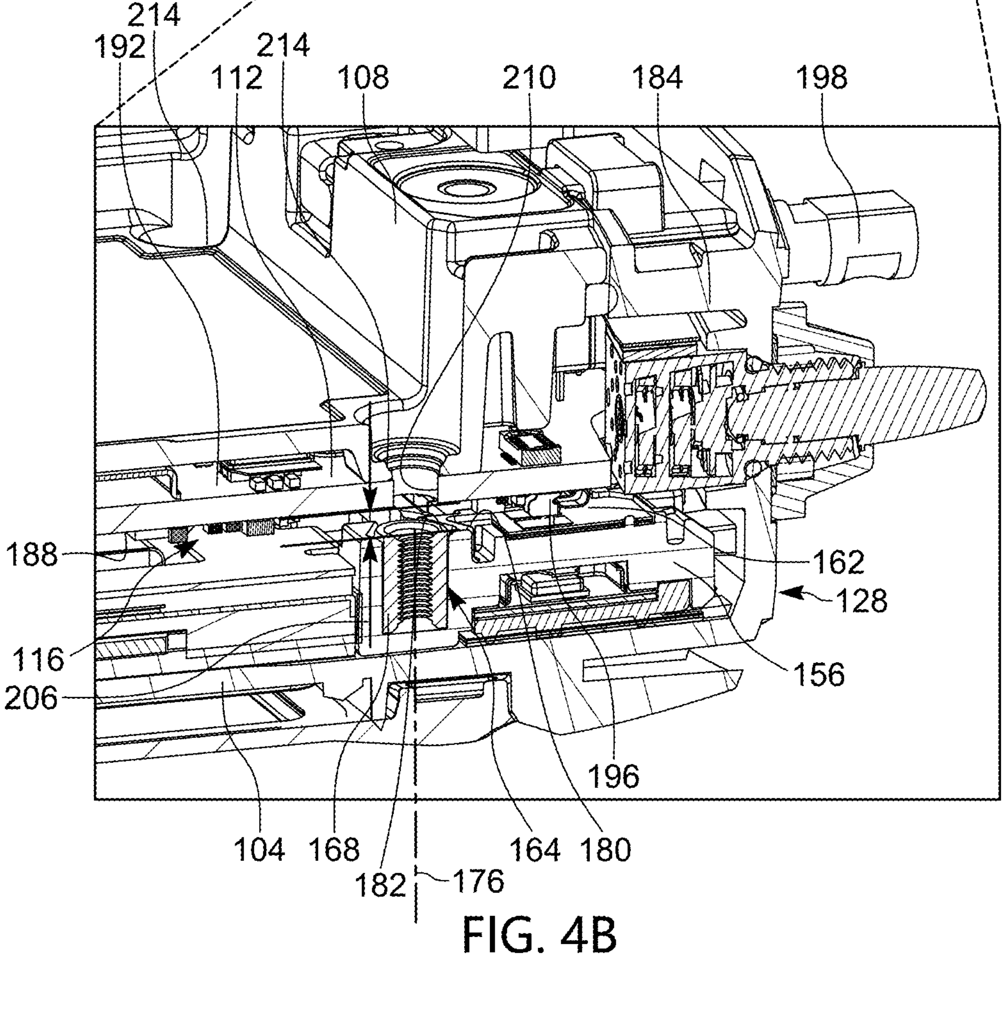
FIG. 4B is an enlarged cross-sectional view of the portable communication device of FIG. 4A, illustrating a gap between the PCB and pocket.

With reference to FIGS. 3A and 3B, the PCB 112 includes a first face 188 and an opposite, second face 192, both of which may support a variety of components (e.g., FETs, capacitors, resistors, inductors, etc.). In particular, the first face 188 of the PCB 112 includes a component 196 that protrudes away from the first face 188 of the PCB 112. In the illustrated example, the component 196 is a microphone spring contact, while in other examples, the component 196 may alternatively be a FET, capacitor, resistor, inductor, flip-switch or other component. In the example shown, the PCB 112 also includes a frequency switch 198 disposed at a distal end of the PCB 112. The frequency switch 198 enables a user to switch between frequency channels during use. When the PCB 112 is disposed within the housing 104, the frequency switch 198 is received within and extends through a hole 202 in the housing 104. When so positioned, the frequency switch 198 is accessible by a user from outside the housing 104 to switch frequency channels during use. As best seen by reference to FIG. 4B, when the PCB 112 is disposed within the housing 104, the component 196 of the PCB 112 interfaces with the microphone flex 162.

With reference to FIGS. 3A-4B, when the PCB 112 is inserted into the housing 104, the component 196 passes directly over the pocket 164 (FIG. 3B) as the frequency switch 198 is inserted into the hole 202. To properly situate the PCB 112 within the housing 104, the PCB 112 is slid along a direction generally parallel to the longitudinal axis 136 from the second end 132 toward the first end 128. The distal end of the PCB 112 gradually reaches the first end 128 of the housing 104, where the cantilevered overhang 184 overlaps the distal end of the PCB 112 and the frequency switch 198 is inserted into the hole 202. During this time, the component 196 passes directly over the pocket 164 (and therefore the nut 168) because the component 196, the microphone flex 162, and the nut 168 are all generally aligned with each other along a direction parallel to the longitudinal axis 136. The component 196 altogether avoids mechanically interfering with the pocket 164 and the nut 168 during the insertion/assembly process because the top surface 182 of the nut 168 (and therefore the top surface 180 of the pocket 164) is spaced away from the PCB 112. Even when the PCB 112 is properly seated within the housing 104, a gap 206 (FIG. 4B) exists between the top surface 180 and the first face 188 of the PCB 112. Since the component 196 passes directly over the pocket 164 and the nut 168 during assembly, the component 196 passes through the gap 206 and avoids mechanically interfering with the pocket 164 and the nut 168. Thus, the gap 206 provides proper clearance for the PCB 112 to be assembled into the housing 104 without collision between the component 196 and the pocket 164 or the nut 168.

With continued reference to the example shown in FIGS. 3A-4B, the PCB 112 includes a pair of first apertures 210 (FIG. 3A) that coaxially align with the slide axis 176 of each pocket 164. The chassis 108 also includes a pair of second apertures 214 (FIG. 4B) that coaxially align with the pair of first apertures 210, and therefore, the slide axis 176 of each pocket 164. For sake of brevity, the pair of pockets 164, the pair of first aperture 210, and the pair of second apertures 214 will be referred to hereinafter as the pocket 164, the first aperture 210, and the second aperture 214.

Figure 5:
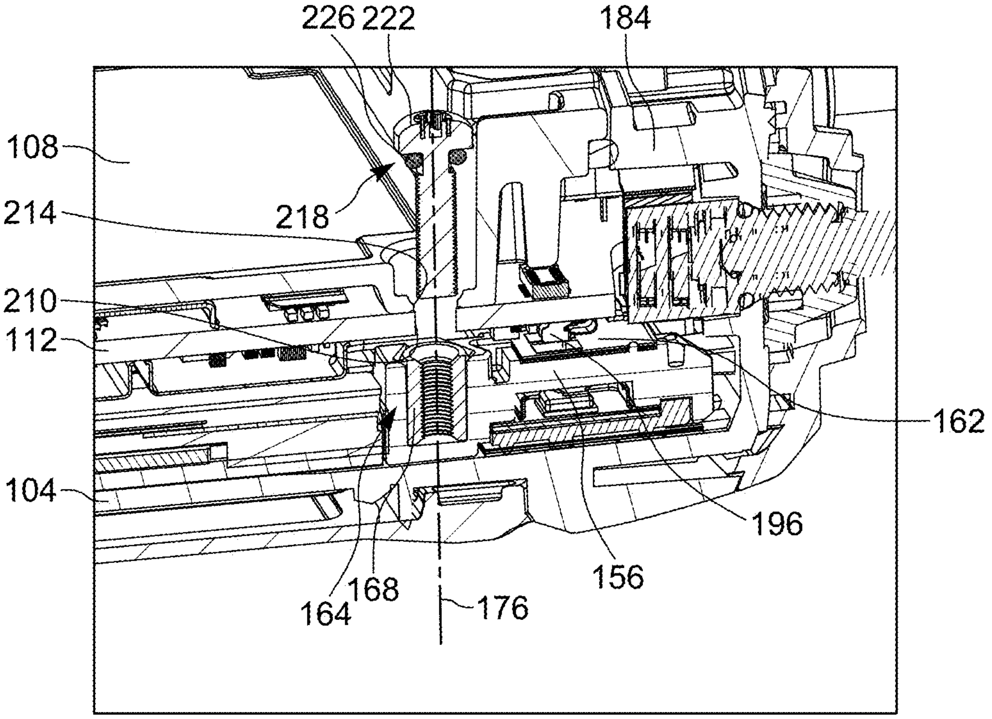
FIG. 5 is a cross-sectional view of the portable communication device along line 3A-3A of FIG. 2, illustrating a fastener being inserted through the chassis and the PCB.
Figure 6:
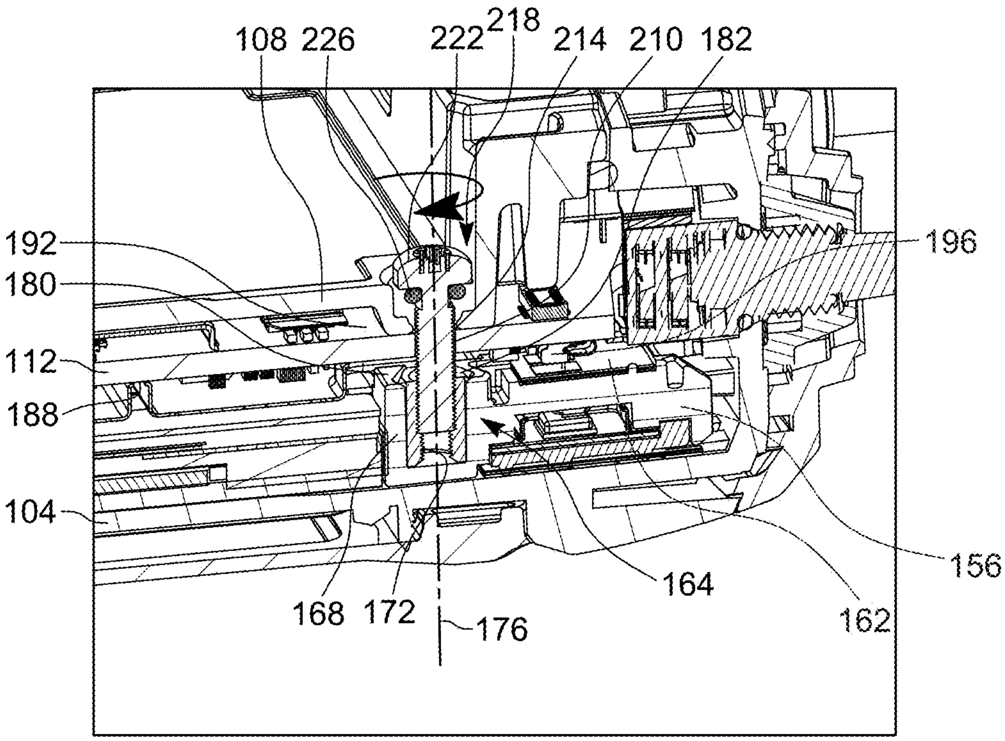
FIG. 6 is a cross-sectional view of the portable communication device along line 3A-3A of FIG. 2, illustrating the fastener engaging the nut in the pocket.
Figure 7:
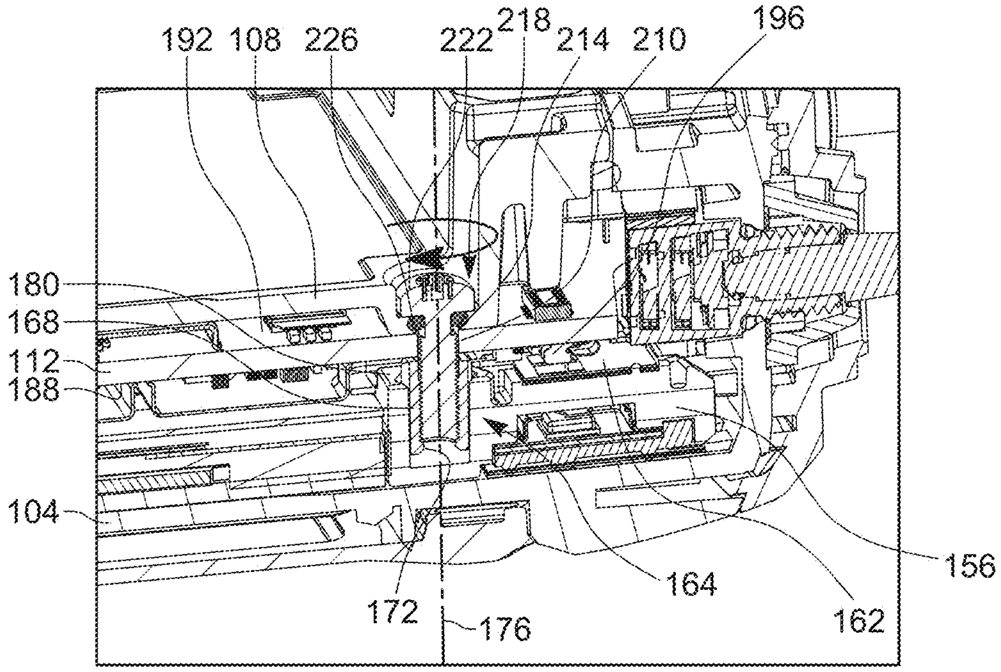
FIG. 7 is a cross-sectional view of the portable communication device along line 3A-3A of FIG. 2, illustrating the nut translating within the pocket as the fastener rotates.

With reference to FIGS. 5-7, the portable communication device also includes a fastener 218 that is configured to couple the housing 104, chassis 108, and the PCB 112 together via the pocket 164 and the nut 168 receives within the pocket 164. In other words, a fastening assembly including the fastener 218, the pocket 164, and the nut 168 couple the chassis 108 and the PCB 112 to the housing 104. The first aperture 210 and the second aperture 214 are sized to accommodate the fastener 218. The fastener 218 passes through the first aperture 210 and the second aperture 214 and rotated about the slide axis 176 relative to the nut 168 to thread into the nut 168. A head 222 of the fastener 218 abuts the chassis 108 adjacent but not touching the second face 192 of the PCB 112 (FIG. 6) as the fastener 218 continues to threadably engage the nut 168. Additional rotation of the fastener 218 draws the nut 168 upward toward the first face 188 of the PCB 112. Thus, the nut 168 slides upward along the slide axis 176 within the pocket 164, closing the gap 206 until the nut 168 abuts the first face 188 of the PCB 112. Stated another way, a portion of the nut 168 extends above the top surface 180 of the pocket 164, while another portion of the nut 168 remains within the pocket 164. As a result, the PCB 112 is inhibited from moving along a direction parallel to the longitudinal axis 136 when the fastener 218 is inserted, thereby coupling the housing 104, chassis 108, and the PCB 112 together.

With continued reference to FIGS. 5-7, the portable communication device also includes a seal 226 that is disposed underneath the head 222 of the fastener 218. Specifically, the seal 226 becomes situated between the head 222 and the chassis 108 when the fastener 218 is threadably engaged with the nut 168. The seal 226 is configured to inhibit ingress of liquid and other debris from entering the internal chamber 116 via the first and second apertures 210, 214.

During one example of the assembly process, the short-range antenna 160 and the microphone flex 162 are coupled to the antenna subframe 156 and the nuts 168 are inserted into the corresponding pockets 164. At this point, the housing 104 first receives the antenna subframe 156 and then receives the PCB 112 and the chassis 108. Specifically, the antenna subframe 156 is inserted into the housing 104 adjacent the first end 128 and under the cantilevered overhang 184. Here, the PCB 112 is slid into the housing 104 along a direction generally parallel to the longitudinal axis 136 with the frequency switch 198 being aligned and inserted into the hole 202. Simultaneously, the component 196 passes through the gap 206 over the pocket 164 and the nut 168, such that the component 196 does not mechanically interfere with either the pocket 164 or the nut 168. When the PCB 112 is properly situated within the housing 104, the first aperture 210 coaxially aligns with the slide axis 176 of the pocket 164. Also, the first face 188 of PCB 112 is spaced away from the top surface 180 of the pocket 164 to define the gap 206. The chassis 108 is subsequently placed on top of the PCB 112 and the second aperture 214 is coaxially aligned with the first aperture 210. The PCB 112, as a result, is enclosed within the internal chamber 116 (FIG. 4A) between the housing 104 and the chassis 108.

The fastener 218 is inserted along the slide axis 176 through the first and second aperture 210, 214 and rotated to threadably engage the nut 168. The fastener 218 is rotated and tightened, drawing the nut 168 along the slide axis 176 until the nut 168 abuts the first face 188 of the PCB 112 and the head 222 of the fastener 218 exerts a downward force on the chassis 108 (and therefore the second face 192 of the PCB 112). As a result, the PCB 112 is coupled to the housing 104 and inhibited from moving in a direction parallel or perpendicular relative to the longitudinal axis 136, thereby ensuring robustness and structural integrity of the PCB 112.

In some examples, the portable communication device 100 includes a tamper resistant mechanism that may meet certain FIPS protection requirements. The portable communication device 100 may be disassembled but must be disassembled properly to avoid initiating a data removal process of information stored on the PCB 112. In such an example, the component 196 may be, for example, a flip-switch instead of a spring contact, in which the flip-switch could be triggered due to improper disassembly. To avoid triggering the tamper resistant mechanism, a downward force is to be applied to the fastener 218 while unthreading the fastener 218 from the nut 168. This ensures the nut 168 slides along the slide axis 176 away from the PCB 112 and returns to a seated position within the pocket 164, such that the nut 168 is flush with the top surface 180 of the pocket 164. Otherwise, the nut 168 may not fully seat within the pocket 164, which may cause mechanical interference between the nut 168 and the component 196 (i.e., flip-switch) during the disassembly process. That is, the nut 168 may contact the component 196 (i.e., flip-switch) if the gap 206 is not clear. In response to contact between the nut 168 and the component 196, the flip-switch is triggered causing the data removal process of information from the PCB 112 to initiate.

In the foregoing specification, specific examples have been described. However, one of ordinary skill in the art appreciates that various modifications and changes can be made without departing from the scope of the claimed subject matter. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting example the term is defined to be within 10%, in another example within 5%, in another example within 1% and in another example within 0.5%. The term "coupled" as used herein is defined as connected, although not necessarily directly and not necessarily mechanically. A device or structure that is "configured" in a certain way is configured in at least that way but may also be configured in ways that are not listed.

It will be appreciated that some examples may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, inventive subject matter lies in less than all features of a single disclosed example. Thus, the following claims are hereby incorporated into the Detailed Description, with each claim standing on its own as a separately claimed subject matter.

What is claimed is:

1. A fastening assembly for coupling a printed circuit board (PCB) to a housing of a portable communication device, the fastening assembly comprising:

- a pocket defining a slide axis, an inner surface, and a top surface that is spaced away from the PCB;
- a nut disposed entirely within the pocket and interfaced with the inner surface to inhibit rotation of the nut about the slide axis; and
- a fastener extending through the PCB to threadably engage the nut when rotated relative to the nut,
- wherein the nut is configured to translate along the slide axis when the fastener is rotated until the nut extends partially out of the pocket and abuts the PCB.

2. The fastening assembly of claim 1, wherein the nut is configured to abut a first face of the PCB after the fastener is rotated, and wherein the fastener is configured to translate along the slide axis while the fastener rotates until a head of the fastener is adjacent but not touching an opposite, second face of the PCB.

3. The fastening assembly of claim 1, wherein the inner surface of the pocket is hex-shaped and the nut is a corresponding hex nut.

4. A method of assembling a portable communication device, the method comprising:

- inserting a nut within a pocket;
- inserting a printed circuit board (PCB) into a housing along a direction generally parallel to a longitudinal axis of the housing, wherein inserting the PCB includes moving the PCB relative to the pocket along the longitudinal axis, and wherein the PCB is spaced away from the pocket after inserting the PCB;
- aligning an aperture of the PCB with the nut; and
- inserting a fastener through the aperture to engage the nut within the pocket and rotating the fastener to threadably engage the nut, causing the nut to slide within the pocket along a slide axis until the nut abuts the PCB,
- wherein the slide axis is perpendicular to the longitudinal axis.

5. The method of claim 4, further comprising coupling an antenna subframe to the housing, the antenna subframe including the pocket and a microphone flex adjacent the pocket.

6. The method of claim 4, further comprising enclosing the PCB between the housing and a chassis.

7. The method of claim 6, further comprising coupling the chassis to the housing via the fastener extending through another aperture in the chassis that aligns with the aperture of the PCB and the nut.

8. The method of claim 4, further comprising inhibiting rotation of the nut by inserting the nut into the pocket having an inner surface with a corresponding shape to the nut.

9. A portable communication device comprising:

- a housing including:
  - a first end,
  - a second end, and
  - a longitudinal axis extending between the first end and the second end;
- a printed circuit board (PCB) disposed within the housing and including an aperture through which a fastener extends to couple the PCB relative to the housing; and
- a pocket disposed within the housing and spaced from the PCB, wherein the pocket is separate from the PCB such that the PCB is configured to be moved relative to the pocket along the longitudinal axis, the pocket defining:
  - a slide axis that extends along a direction perpendicular to the longitudinal axis,
  - a top surface that is spaced away from the PCB along the slide axis, and
  - an inner surface that supports a nut and inhibits the nut from rotating about the slide axis,
- wherein the nut is configured to translate along the slide axis when the fastener is rotated until the nut abuts the PCB.

10. The portable communication device of claim 9, wherein the nut is configured to abut a first face of the PCB after the fastener has been rotated, and wherein the fastener is configured to translate along the slide axis while the fastener rotates until the fastener exerts a force on an opposite, second face of the PCB.

11. The portable communication device of claim 9, further comprising an antenna subframe coupled to the housing adjacent the first end and a microphone flex supported by the antenna subframe.

12. The portable communication device of claim 11, wherein the pocket is provided on the antenna subframe.

13. The portable communication device of claim 11, wherein the first end of the housing includes a cantilevered overhang that extends towards the second end of the housing and at least partially overlaps the microphone flex.

14. The portable communication device of claim 9, further comprising a chassis coupled to the housing and an internal chamber defined between the chassis and the housing, and wherein the PCB is disposed within the internal chamber.

15. The portable communication device of claim 14, wherein the aperture of the PCB is a first aperture, and wherein the chassis further includes a second aperture that coaxially aligns with the first aperture along the slide axis to enable the fastener to pass through both the second aperture of the chassis and the first aperture of the PCB.

16. The portable communication device of claim 15, further comprising a seal disposed between a head of the fastener and the chassis to inhibit ingress of liquid and other debris into the internal chamber.

17. The portable communication device of claim 9, further comprising a gap between the top surface of the pocket and the PCB, such that the top surface of the pocket and a top surface of the nut are both spaced away from the PCB, and wherein a component of the PCB protrudes from the PCB and is enabled to move through the gap without mechanically interfering with the pocket or the nut during an assembly process.

18. The portable communication device of claim 17, wherein the component of the PCB is configured to initiate a data removal process of information stored on the PCB if, during a disassembly process, the nut is in the gap and the component of the PCB contacts the nut.

19. The portable communication device of claim 9, further comprising a rail along the housing that engages the PCB and inhibits movement of the PCB along a direction perpendicular to the longitudinal axis, and wherein the fastener inhibits movement of the PCB along a direction parallel to the longitudinal axis, thereby coupling the PCB to the housing.

20. The portable communication device of claim 9, wherein the inner surface of the pocket is hex-shaped and the nut is a corresponding hex nut.

* * * * *